(12) United States Patent
Yokoyama

(10) Patent No.: US 7,286,390 B2
(45) Date of Patent: Oct. 23, 2007

(54) MEMORY CELL AND SEMICONDUCTOR INTEGRATED CIRCUIT DEVICE

(75) Inventor: Yoshisato Yokoyama, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 3 days.

(21) Appl. No.: 11/330,140

(22) Filed: Jan. 12, 2006

(65) Prior Publication Data

US 2006/0158926 A1    Jul. 20, 2006

(30) Foreign Application Priority Data

Jan. 14, 2005  (JP)  ............................. 2005-008382

(51) Int. Cl.
*G11C 11/40* (2006.01)
(52) U.S. Cl. .................. 365/154; 365/230.06
(58) Field of Classification Search ................ 365/156
See application file for complete search history.

(56) References Cited

U.S. PATENT DOCUMENTS 4,175,290 A * 11/1979 Harari ................... 365/185.07
4,375,677 A * 3/1983 Schuermeyer ............. 365/154
6,975,532 B1* 12/2005 Kosonocky et al. ........ 365/154

FOREIGN PATENT DOCUMENTS

| JP | 5-144265 | 6/1993 |
| JP | 6-236688 | 8/1994 |
| JP | 2001-93993 | 4/2001 |
| JP | 2001-525098 | 12/2001 |
| JP | 2002-32990 | 1/2002 |
| JP | 2002-42476 | 2/2002 |

\* cited by examiner

*Primary Examiner*—Tan T. Nguyen
(74) *Attorney, Agent, or Firm*—McGinn IP Law Group, PLLC

(57) ABSTRACT

A memory cell includes a memory cell section and a switching section. The memory cell section includes first and second inverters which are connected to form a flip-flop, and each of the first and second inverters comprises a load transistor and a drive transistor. The switching section is connected with a word line and configured to operatively disconnect the drive transistors of the first and second inverters from a power source when the word line is driven.

16 Claims, 9 Drawing Sheets

MEMORY CELL AND SEMICONDUCTOR INTEGRATED CIRCUIT DEVICE

BACKGROUND OF THE INVENTION

1. Field of the Invention

The present invention relates to a memory cell, and more particularly relates to a static random access memory cell and a semiconductor integrated circuit device using the same.

2. Description of the Related Art

In recent years, a semiconductor integrated circuit device includes a semiconductor memory to write and read a data, and this is used in a computer system, a portable telephone and the like. As the semiconductor memory, DRAM (Dynamic Random Access Memory), SRAM (Static Random Access Memory), a non-volatile memory and the like are known.

A gate array is disclosed in Japanese Laid Open Patent Application (JP-A-Heisei, 6-236688). In this first conventional example, a gate array device is composed of basic cell transistors having a same dimension, and the operation speed and stability of a high-speed memory cell is accomplished at small electric power consumption.

A semiconductor device is disclosed in Japanese Laid Open Patent Application (JP-P2001-93993A). In this second conventional example, a static memory operates at as low voltage as a power source voltage of about 1 V, and a small electric power consumption and improvement of an operation speed is accomplished, while avoiding a leakage current at a waiting state through a sub threshold current.

A semiconductor memory device of a static type is disclosed in Japanese Laid Open Patent Application (JP-P2002-32990A). In this third conventional example, even if a defective memory cell is produced, the memory device can be relieved while a standby current is suppressed.

Japanese Laid Open Patent Application (JP-P 2002-42476A) discloses a semiconductor memory device of a static type where a write margin can be set.

Japanese Laid Open Patent Application (JP-A-Heisei, 5-144265) discloses a semiconductor memory device as a fourth conventional example which data can be cleared from or set in a memory cell at a high speed while a higher integration is attained.

Japanese Laid Open Patent Application (JP-P2001-525098A) discloses a method and an apparatus as a fifth conventional example which enlarge the width of a write margin and a read stability margin of a memory cell, without requiring any voltage higher than a power source voltage and any voltage lower than a ground voltage.

Figure 1:
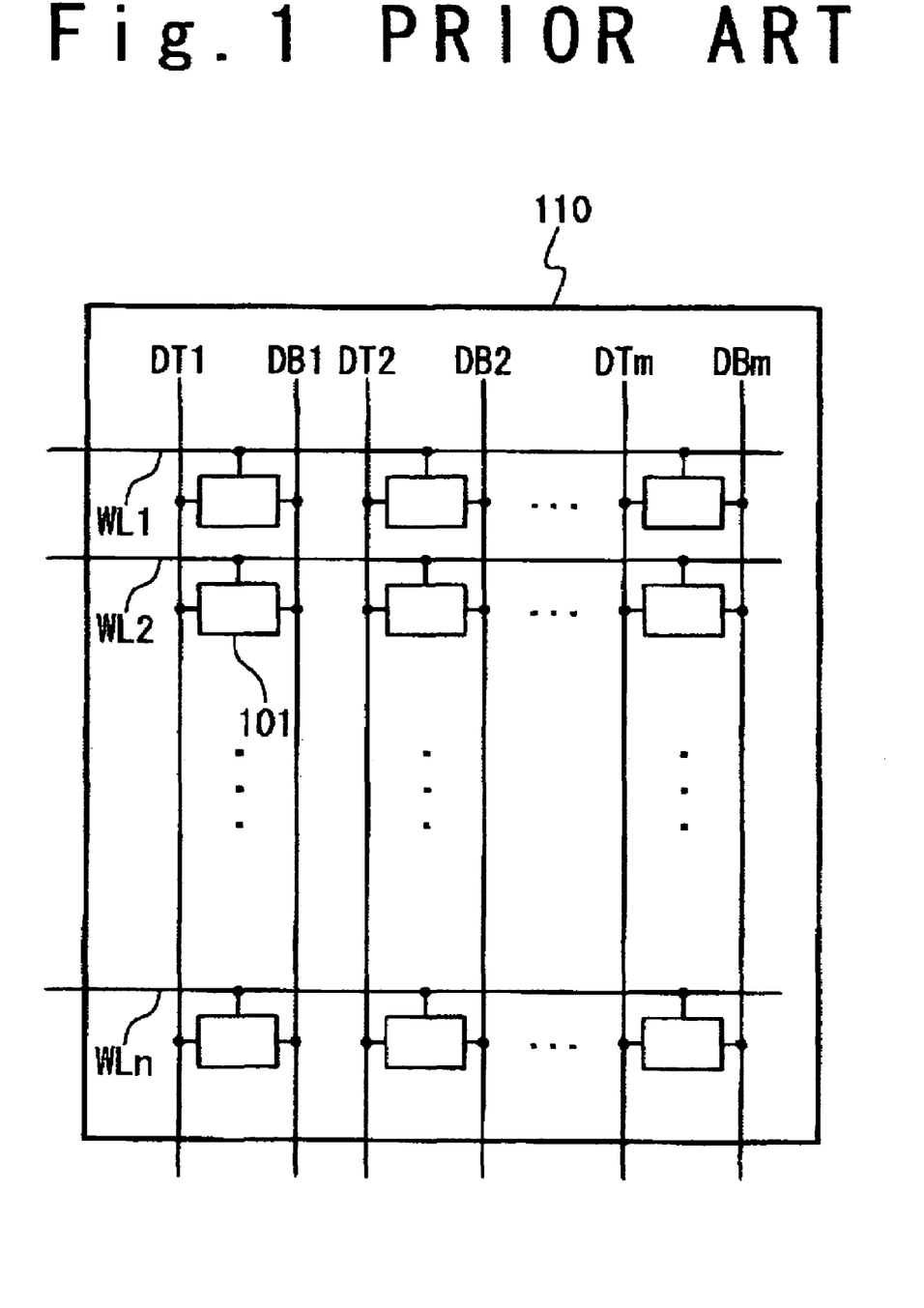
FIG. 1 is a block diagram showing a configuration of a semiconductor integrated circuit device with a typical static random access memory cell.

FIG. 1 shows the configuration of a semiconductor integrated circuit device in which a typical SRAM cell array 110 is provided. The memory cell array 110 is provided with memory cells 101 of m columns and n rows (m and n are integers of 2 or more). Word lines WL1 to WLn are connected to the n rows of the memory cells 101 in the memory cell array 110, respectively, and n pairs of digit lines DT1 and DB1 to DTm and DBm are connected to m columns of the memory cells 101 in the memory cell array 110, respectively.

Figure 2:
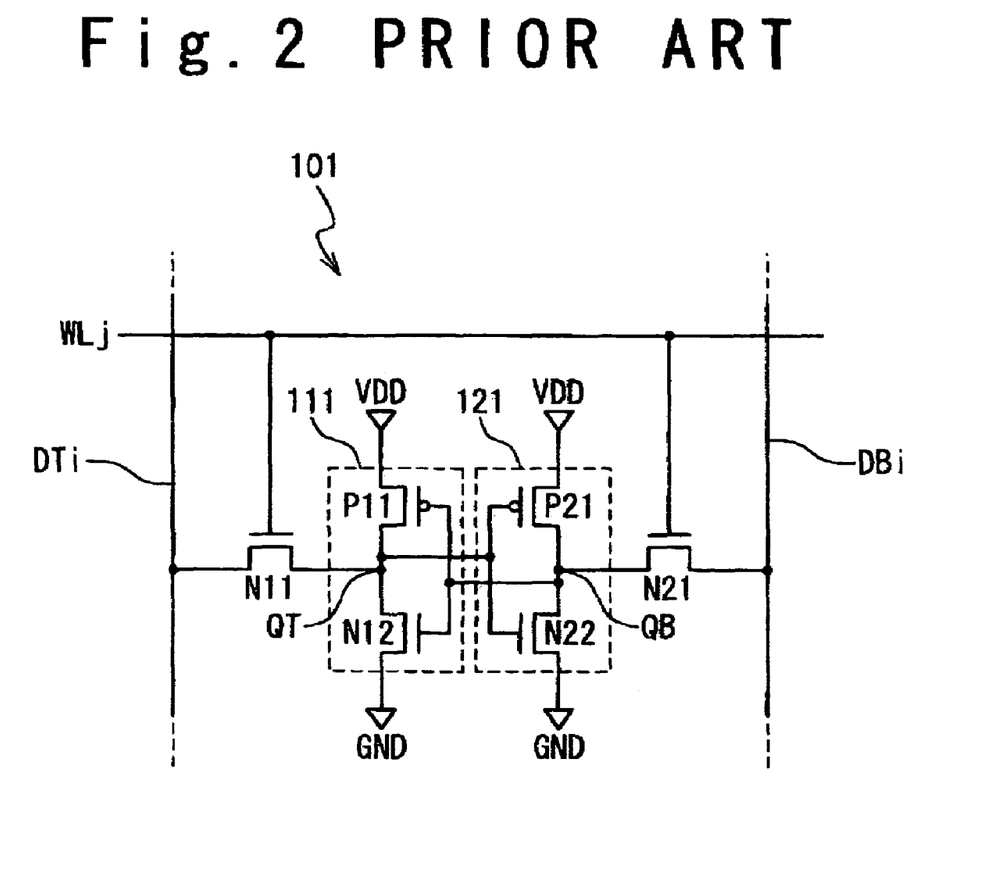
FIG. 2 is a circuit diagram showing a typical conventional static random access memory cell of six transistors.

The memory cell 101 on the $i^{th}$ column and $j^{th}$ row (i=1, 2 to m, j=1, 2 to n) of the memory cell array 110 includes inverters 111 and 121 and access transistors (path gate transistors) N11 AND N21, which are N-channel type MOS (NMOS) transistors, as shown in FIG. 2.

The inverters 111 and 121 are connected to each other in a crosswise manner to form a flip-flop. The inverter 111 includes a load transistor P11 that is a P-channel type MOS (PMOS) transistor, and a drive transistor N12 that is an NMOS transistor. The inverter 121 includes a load transistor P21 that is a PMOS transistor, and a drive transistor N22 that is the NMOS transistor. In the access transistor N11, its gate is connected to the word line WLj, its drain is connected to the digit line DTi, and its source is connected through a node QT to a drain of the drive transistor N12, a gate of the drive transistor N22, a drain of the load transistor P11, and a gate of the load transistor P21. In the access transistor N21, its gate is connected to the word line WLj, its drain is connected to the digit line DBi, and its source is connected through a node QB to a gate of the drive transistor N12, a drain of the drive transistor N22, a drain of the load transistor P21, and a gate of the load transistor P11. The sources of the load transistors P11 and P21 are connected to a power source, and a power source voltage VDD is supplied from the power source to the sources. The sources of the drive transistors N12 and N22 are grounded, and a ground voltage GND is supplied to the sources.

In the memory cell 101 composed of the 6 transistors shown in FIG. 2, a ratio of the current capability between the access transistor N11 or N21 activated through the word line WLj and the drive transistor N12 or N22 in a latching section is usually assumed to be about 1:3. Also, the current capability of the load transistors P11 and P21 in the latching section are assumed to be equal to or less than those of the access transistors N11 and N21 to achieve a fast stable operation.

However, when respective transistors have a same current capability as in a gate array and the like, there is a case that an operation margin becomes extremely small.

Figure 3:
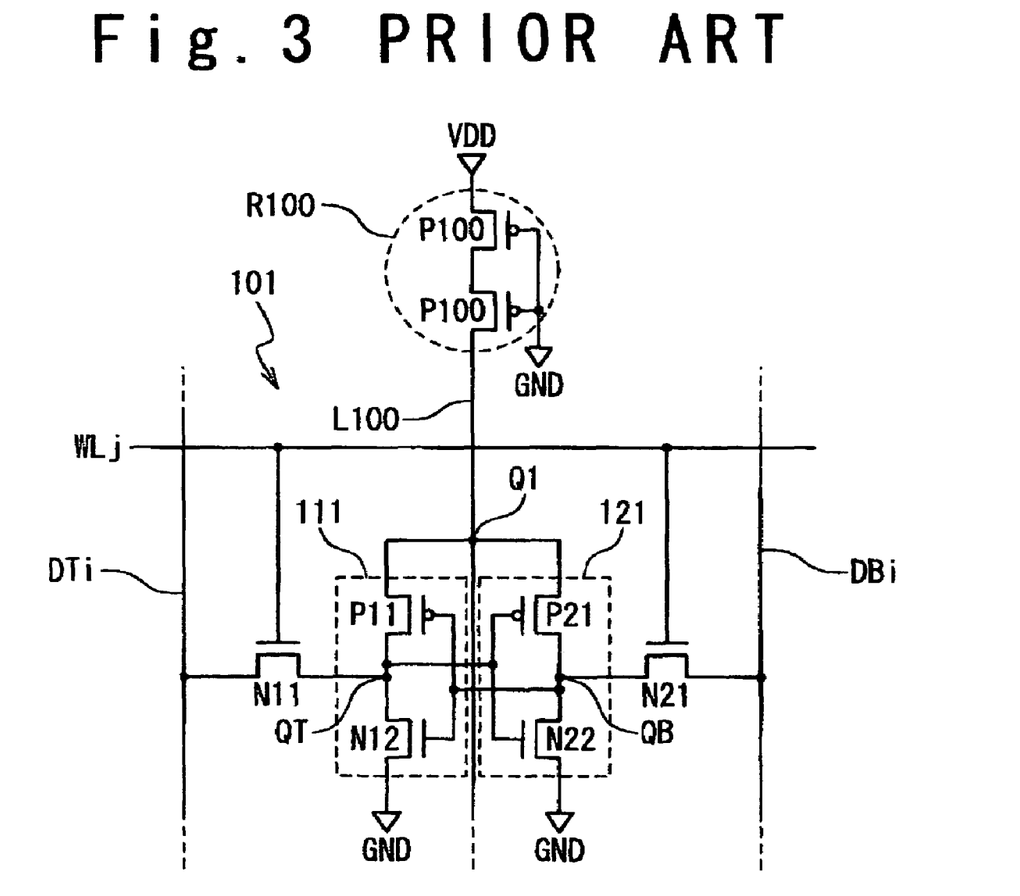
FIG. 3 is a circuit diagram showing a first conventional example of the static random access memory cell.

For the above reason, in the above first conventional example (Japanese Laid Open Patent Application (JP-A-Heisei, 6-236688)), as shown in FIG. 3, a plurality of resistance element PMOS transistors P100 are provided between the inverters 111 and 121 of the memory cell 101 and the power source VDD. The plurality of resistance element transistors P100 are connected in series. The gates of the resistance element transistors P100 are grounded, and the resistance element transistors P100 are always on-states. Thus, a resistance unit R100 is formed. The power source voltage VDD is supplied to a source of a first one of the series-connected resistance element transistors P100. A drain of the last one of the series-connected resistance element transistors P100 is connected through a wiring L100 to a node Q1. The source of the load transistor P11 of the inverter 111 and the source of the load transistor P21 of the inverter 121 are connected to the node Q1.

In this way, according to the memory cell 101 of the first conventional example, it is possible to reduce the current capability of the load transistors P11 and P21 and attain the fast stable operation, even if the basic 6 transistors have the similar current capability.

Also, according to the memory cell 101 of the first conventional example, since the resistance section R100 is connected in series to the load transistors P11 and P21, the voltages of the sources of the load transistors P11 and P21 are downed. As a result, the current capability of the load transistors P11 and P21 can be made smaller than those of the drive transistors N12 and N22 and access transistors N11 and N21.

Also, according to the memory cell 101 of the first conventional memory cell 101, the resistance section R100 is connected through the wiring L100 to the plurality of memory cells 101 connected to the digit lines DTi and DBi.

Thus, the employment of one resistance section R100 can improve the operations of the plurality of memory cells 101.

However, in the memory cell 101 of the first conventional example, the resistance section R100 is connected through the wiring L100 to the plurality of memory cells 101 which are connected to the digit lines DTi and DBi. Therefore, the wiring L100 becomes long in order to connect the resistance section R100 and the plurality of memory cells 101 which are connected to the digit lines DTi and DBi. Thus, a large parasitic capacitance is generated. When a cell data as the voltage applied to the node QT of the memory cell 101 is rewritten from HIGH to LOW, the voltage of the node Q1 of the memory cell 101 must be reduced at the same time. However, due to the parasitic capacitance of the wiring L100 and the resistance section R100, the voltage of the node Q1 is reduced depending on an RC time constant. Thus, the fast writing operation is prevented.

SUMMARY OF THE INVENTION

In an aspect of the present invention, a memory cell includes a memory cell section and a switching section. The memory cell section includes first and second inverters which are connected to form a flip-flop, and each of the first and second inverters comprises a load transistor and a drive transistor. The switching section is connected with a word line and configured to operatively disconnect the drive transistors of the first and second inverters from a power source when the word line is driven.

Here, the memory cell may further includes first and second access transistors connected with the word line, provided between the output terminals of the first and second inverters and first and second digit lines, respectively, such that the first and second access transistors are turned on when the word line is driven.

Also, the switching section may include first and second switch sections respectively provided for the first and second inverters to operatively disconnect the drive transistors of the first and second inverters from a power source when the word line is driven.

I this case, the first and second switch sections may be connected with the word line and provided between the power source and the first and second inverters. When the word line is driven, the first switch section preferably shunts off a current path between the power source and the first inverter, and the second switch section preferably shunts off a current path between the power source and the second inverter.

Also, when the first and second inverters are connected with the power source, the first switch section is preferably connected with the word line and provided between the load transistor and the drive transistors of the first inverter. Also, the second switch section is connected with the word line and provided between the load transistor and the drive transistors of the second inverter. When the word line is driven, the first switch section preferably shunts off a current path between the load transistor and the drive transistor in the first inverter, and the second switch section preferably shunts off a current path between the load transistor and the drive transistor in the second inverter.

Also, each of the first and second switch sections may have a gate connected with the word line and may include a MOS transistor of a same conductive type as the load transistor, and the drive transistors in the first and second inverters preferably are of a different conductive type from the load transistor.

In another aspect of the present invention, a semiconductor integrated circuit device includes a memory cell array and an address control section. The memory cell array includes a plurality of word lines extending into a first direction, a plurality of pairs of digit lines extending into a second direction substantially orthogonal to the first direction, and a plurality of memory cells arranged in a matrix at intersections of the plurality of word lines and the plurality of pairs of digit lines. The address control section selects one of the plurality of word lines based on a first address. Each of the plurality of memory cells includes a memory cell section with first and second inverters which are connected to form a flip-flop, wherein each of the first and second inverters may include a load transistor and a drive transistor; and a switching section connected with one of the plurality of word lines and configured to operatively disconnect the drive transistors of the first and second inverters from a power source when the word line is selected.

In this case, the memory cell may further includes first and second access transistors connected with the word line, provided between the output terminals of the first and second inverters and digit lines of a corresponding one of the plurality of pairs, respectively, such that the first and second access transistors are turned on when the word line is selected.

Also, the switching section may include first and second switch sections respectively provided for the first and second inverters to operatively disconnect the drive transistors of the first and second inverters from a power source when the word line is selected.

In this case, the first and second switch sections are preferably connected with the word line and provided between the power source and the first and second inverters. When the word line is driven, the first switch section preferably shunts off a current path between the power source and the first inverter, and the second switch section preferably shunts off a current path between the power source and the second inverter.

Also, when the first and second inverters are connected with the power source, the first switch section is preferably connected with the word line and provided between the load transistor and the drive transistors of the first inverter, and the second switch section is preferably connected with the word line and provided between the load transistor and the drive transistors of the second inverter. When the word line is driven, the first switch section preferably shunts off a current path between the load transistor and the drive transistor in the first inverter, and the second switch section preferably shunts off a current path between the load transistor and the drive transistor in the second inverter.

Also, each of the first and second switch sections has a gate connected with the word line and may include a MOS transistor of a same conductive type as a load transistor as the load, and the drive transistors in the first and second inverters is of a different conductive type from the load transistor.

In another aspect of the present invention, a semiconductor integrated circuit device includes first and second p-type diffusion layers arranged in a first direction; first and second n-type diffusion layers arranged in the first direction along the first and second p-type diffusion layers; first and second gate lines provided above the first p- and n-type diffusion layers to extend in a second direction orthogonal to the first direction such that first and second p-channel transistors and first and second n-channel transistors are formed; third and fourth gate lines provided above the second p- and n-type diffusion layers to extend in the second direction such that third and fourth p-channel transistors and third and fourth n-channel transistors are formed; a word line provided above the first to fourth gate lines to extend in the first direction and connected with the first and fourth gate lines. The second p- and n-channel transistors forms a first inverter, and the third p- and n-channel transistors forms a second inverter, and the first and second inverter are connected with each other to form a flip-flop. The first and fourth n-channel transistors are connected with digit lines, respectively, and sources of the second and third n-channel transistors are connected to a ground voltage.

In this case, the first p-channel transistor may be connected between the second p-channel transistor and the second n-channel transistor, and the fourth p-channel transistor may be connected between the third p-channel transistor and the third n-channel transistor. Sources of the second and third p-channel transistors may be connected with a power source.

Also, sources of the first and fourth p-channel transistors are connected with a power source. The first p-channel transistor may be connected between the power source and the second p-channel transistor, and the fourth p-channel transistor may be connected between the power source and the third p-channel transistor.

In this case, a first common region as a drain of the first p-channel transistor and a source of the second p-channel transistor may be connected with a second common region as a drain of the fourth p-channel transistor and a source of the third p-channel transistor.

DESCRIPTION OF THE PREFERRED EMBODIMENTS

Hereinafter, a semiconductor integrated circuit device with SRAM cells as memory cells according to the present invention will be described in detail with reference to the attached drawings.

First Embodiment

Figure 4:
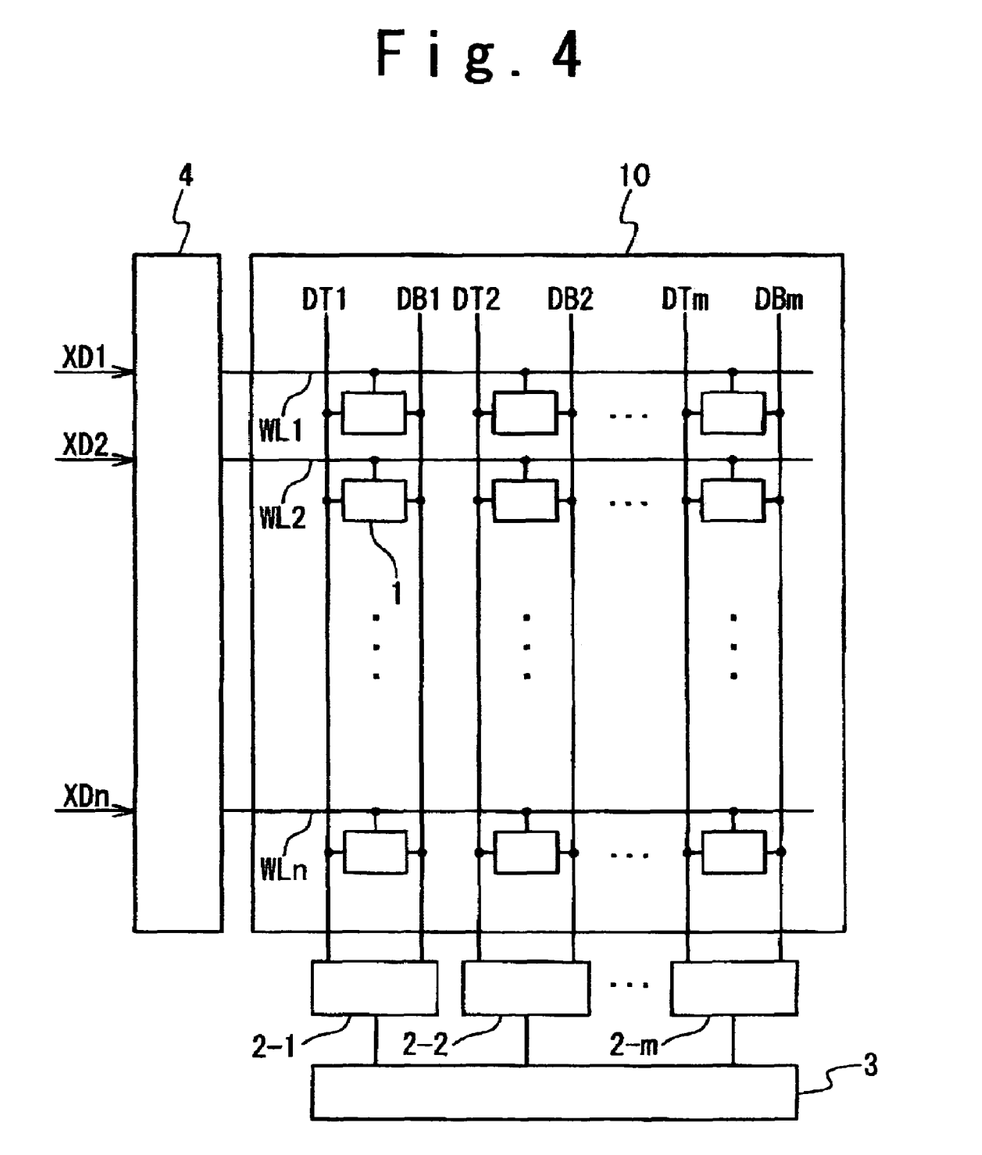
FIG. 4 is a block diagram showing a configuration of a semiconductor integrated circuit device with static random access memory cells according to the present invention.

FIG. 4 is a block diagram showing the configuration of the semiconductor integrated circuit device with memory cells 1 according to the first embodiment of the present invention. The semiconductor integrated circuit device has a memory cell array 10 in which the memory cells 1 are arranged in a matrix of m columns and n rows (m and n are integers of 2 or more), pre-charging circuits 2-1 to 2-m, an input/output circuit 3 and an address controller 4. Word lines WL1 to WLn are connected to the plurality of rows of the memory cells 1 in the memory cell array 1, respectively. Pairs of digit lines DT1 and DB1 to DTm and DBm are connected to the plurality of rows of the memory cells 1 in the memory cell array 1, respectively.

The pre-charging circuits 2-1 to 2-m are connected to the pairs of bit lines DT1 and DB1 to DTm and DBm, respectively, and charge the pairs of bit lines DT1 and DB1 to DTm and DBm to the power source voltage VDD, respectively. The input/output circuit 3 operates in accordance with a clock. The input/output circuit 3 has sense amplifiers connected through the pre-charging circuits 2-1 to 2-m to the pairs of bit lines DT1 and DB1 to DTm and DBm.

The address controller 4 operates in response to a clock signal. The address controller 4 is supplied with a decoded signal XDj obtained by decoding a row address at the time of a reading or writing operation. At this time, the address controller 4 drives the word line WLj of the word lines WL1 to WLn based on the decoded address signal XDj in response to the clock, and supplies a power source voltage VDD to the word line WLj, so that the voltage supplied to the word line WLj is changed from an inactive (LOW) state of the ground voltage GND to an active (HIGH) state of the power source voltage VDD.

Figure 5:
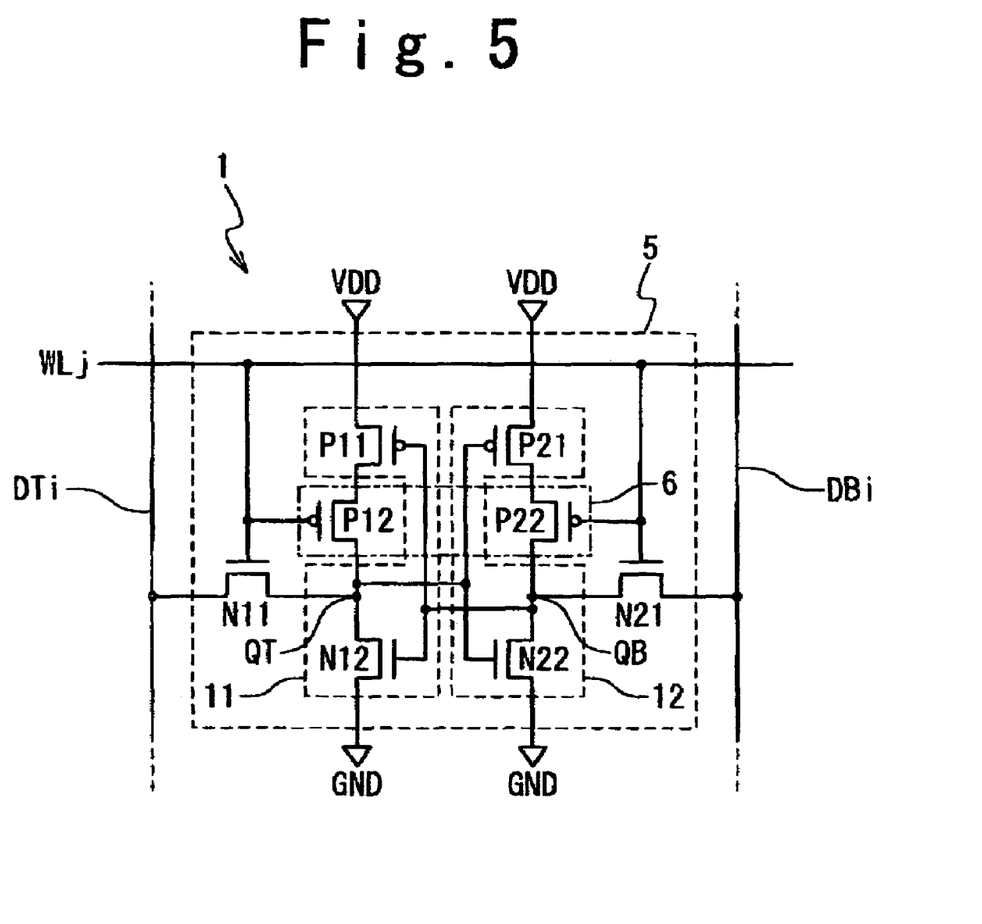
FIG. 5 is a circuit diagram showing the static random access memory cell according to a first embodiment of the present invention.

The memory cell 1 on the $i^{th}$ column and $j^{th}$ row has a memory cell section 5 and a switching section 6, as shown in FIG. 5. The memory cell section 5 includes inverters 11 and 21 and access transistors (path gate transistors) N11 and N21, which are N-channel type MOS (NMOS) transistors. The inverters 11 and 21 are connected in a crosswise manner to form a flip-flop or a latch circuit. The inverter 11 includes a load transistor P11 of a P-channel type MOS (PMOS) transistor, and a drive transistor N12 of an NMOS transistor. The inverter 21 includes a load transistor P21 of a PMOS transistor and a drive transistor N22 of the NMOS transistor.

The switching section 6 includes power source control transistors P12 and P22 as first and second switching sections, respectively. The power source control transistor P12 is provided between a load transistor P11 and a drive transistor N12 in the inverter 11. The power source control transistor P22 is provided between a load transistor P21 and a drive transistor N22 in the inverter 21. In this case, in the access transistor N11, its gate is connected to the word line WLj and a gate of the power source control transistor P12, its drain is connected to the digit line DTi, and its source is connected through a node QT to a drain of the drive transistor N12, a gate of the drive transistor N22, a drain of the power source control transistor P12, and a gate of the load transistor P21. In the access transistor N21, its gate is connected to the word line WLj and a gate of the power source control transistor P22, its drain is connected to the digit line DBi, and its source is connected through a node QB to a gate of the drive transistor N12, a drain of the drive transistor N22, a drain of the power source control transistor P22, and a gate of the load transistor P11.

In the power source control transistor P22, its gate is connected to the word line WL, its drain is connected to the node QB, and its source is connected to the drain of the load transistor P21. The sources of the load transistors P11 and P21 are connected to the power source, and the power source voltage VDD is supplied from the power source to these sources. The sources of the drive transistors N12 and N22 are grounded, and the ground voltage GND is supplied to these sources.

At the time of the writing operation, when the word line WLj is selected and driven, namely, when the voltage supplied to the word line WLj indicates the active state (HIGH), the power source control transistors P12 and P22 in the memory cell 1 connected to the word line WLj block supply of currents from the load transistors P11 and P21 to the drive transistors N12 and N22, respectively. In other words, the power source control transistors P12 and P22 operatively disconnect the drive transistors N12 and N22 from the load transistors P11 and P21, respectively. This will be described below.

Originally, at the time of the writing operation, a bus fight is generated by the load transistor P11 and a write buffer (not shown) provided on the digit line DTi through the access transistor N11. As the result of the bus fight, the cell data as the voltage held in the node QT is inverted from HIGH to LOW.

In the memory cell 1 in the present invention, when the voltage supplied to the word line WLj rises from LOW to HIGH, the power source control transistors P12 and P22 are turned OFF to shut off the current paths from the power source voltage VDD to the output nodes QT and QB in the inverters 11 and 21. As this result, it is possible to easily rewrite the cell data from HIGH to LOW without any bus fight between the writing buffer and the load transistor P11. Thus, the speed of the writing operation can be made very faster.

On the other hand, charge after the pre-charging operation remains on the bit line DBi. The charge flows into the drive transistor N22 through the access transistor N21, so that the voltage of the node QB is set to a middle level. After that, when the writing operation is ended, the word line WLj downs from the HIGH to LOW, the access transistors N11 AND N21 are turned OFF, and the power source control transistors P12 and P22 are turned ON. At this time, due to the voltage balance between the nodes QT and QB, the node QT is set to the low level, and also the node QB is set to the high level.

Figure 6:
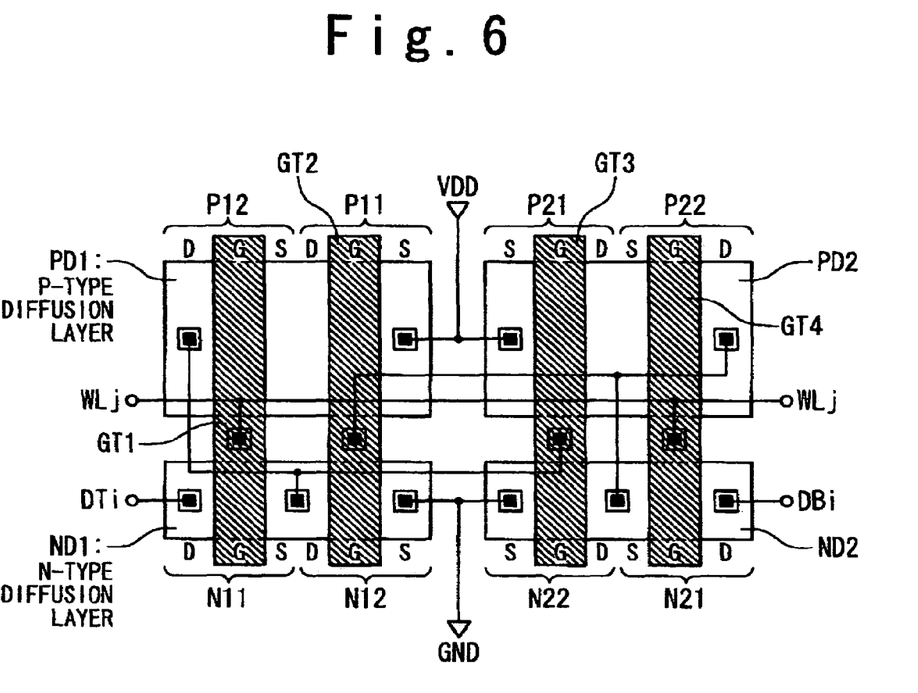
FIG. 6 is a layout diagram showing the static random access memory cell according to the first embodiment of the present invention.

According to the present invention, the wiring pattern as shown in FIG. 6 can be used to form the memory cell 1 in the semiconductor integrated circuit device such as a gate array that P-channel type MOS transistors and N-channel type MOS transistors are formed in an array in advance in a transistor forming process (pre-process), and the foregoing MOS transistors are connected by wirings in the post wiring process (post process) to produce an optional logical circuit. That is, according to the present invention, the memory cell is formed from the eight transistors of the four P-channel type MOS transistors and the four N-channel type MOS transistors. As compared with the conventional CMOS SRAM cell formed from the 6 transistors of the two P-channel type MOS transistors and the four N-channel type MOS transistors, the two P-channel type MOS transistors for the power source control are added. Although a layout area in the present invention seems to be wider than that of the conventional SRAM cell formed from the 6 transistors, the P-channel type MOS transistors are typically formed to be equal in number to the N-channel type MOS transistors in the semiconductor integrated circuit device such as the gate array. Also, the sizes of the transistors are designed such that a same current drive capability is attained between the P-channel type MOS transistor and the N-channel type MOS transistor, by considering general-purpose use and flexibility of a logic circuit to be produced. Therefore, in the conventional memory cell, the two P-channel type transistors are left without being used. However, in the present invention, the unused two P-channel type transistors are additionally used for the power source voltage control. Therefore, the increase of a chip area is not required.

Next, the layout of the memory cell will be described.

N-type diffusion layers ND1 and ND2 are arranged in a horizontal direction and P-type diffusion layers PD1 and PD2 are arranged in the horizontal direction. The P-type diffusion layers PD1 and PD2 are arranged in a vertical direction from the N-type diffusion-layers ND1 and ND2, respectively. Gate patterns GT1 and GT2 are formed on the P- and N-type diffusion layers PD1 and ND1 to form the transistors P12 and P11 for the diffusion layer PD1 and the transistors N11 and N12 for the diffusion layer ND1. Also, Gate patterns GT3 and GT4 are formed on the P- and N-type diffusion layers PD2 and ND2 to form the transistors P21 and P22 for the diffusion layer PD2 and the transistors N22 and N21 for the diffusion layer ND2. Thus, the source of the transistor P12 and the drain of the transistor P11 are common, the source of the transistor N11 and the drain of the transistor N12 are common, the source of the transistor P22 and the drain of the transistor P21 are common, and the source of the transistor N21 and the drain of the transistor N22 are common.

In this case, the drain of the drive transistor N22, the source of the access transistor N21 and the drain of the power source control transistor P22 are connected the gate pattern GT2 by a first wiring. The source of the access transistor N11, the drain of the drive transistor N12 and the drain of the power source control transistor P12 are connected to the gate pattern GT3 by a second wiring. The word line WLj is connected to the gate patterns GT1 and GT4. The sources of the load transistors P11 and P21 are connected to the power source voltage VDD, and the sources of the drive transistors N12 and N22 are connected to the ground voltage. The word line WLj may be formed above or below the first and second wirings.

The operation of the semiconductor integrated circuit device with the memory cell 1 according to the present invention will be described below. In this embodiment, the writing operation when a cell data as the voltage of the node QT is rewritten from HIGH to LOW will be described with reference to FIG. 7. In the operation in this case, a driving step, a power source supply stopping step and a drive ending step are carried out in the semiconductor integrated circuit device.

Figure 7:
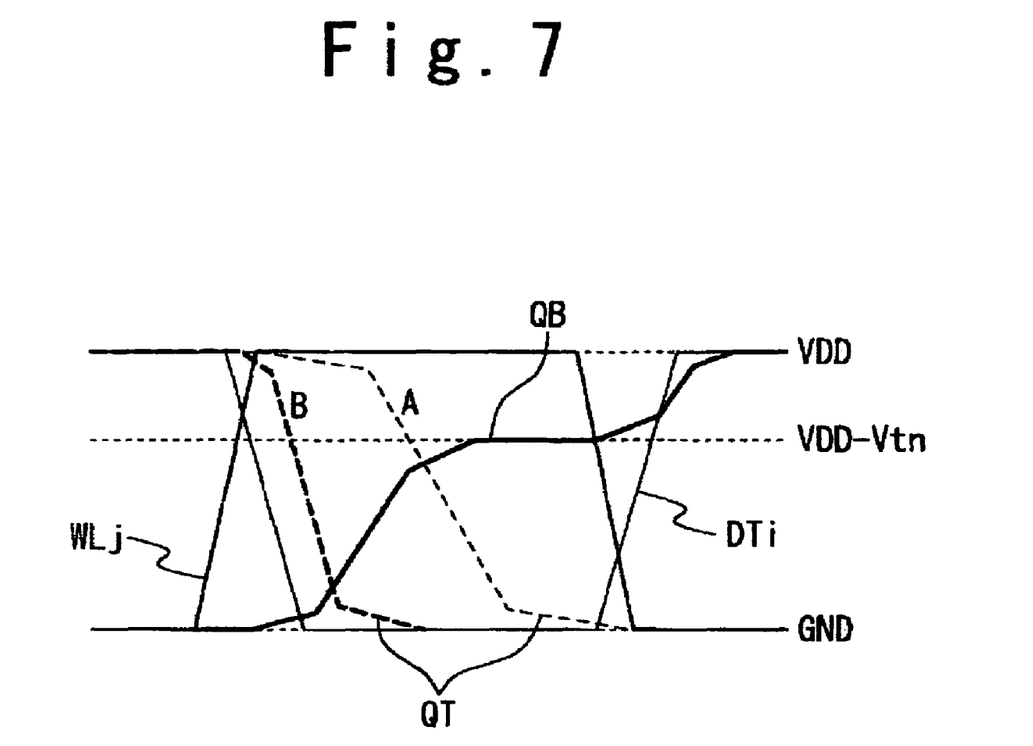
FIG. 7 is timing charts in a writing operation of the static random access memory cell according to the first embodiment of the present invention.

At first, at the driving step of the writing operation, the decoded address signal XDj as a first address is sent to the address controller 4. The address controller 4 selects the word line WLj of the word lines WL1 to WLn based on the decoded address signal XDj in response to the rising of the clock, as shown in FIG. 7 by a solid line. At this time, the address controller 4 supplies the power source voltage VDD to the word line WLj to drive it, so that the voltage supplied to the word line WLj is changed from the ground voltage GND (LOW) to the power source voltage VDD (HIGH). Also, the input/output circuit 3 supplies the ground voltage GND through the pre-charging circuit 2-i to the digit line DTi in response to the rising of the clock and changes the voltage to be supplied to the digit line DTi from the power source voltage VDD (HIGH) to the ground voltage GND (LOW), as shown in FIG. 7 by a thin solid line.

Next, at the power source supply stopping step, when the voltage of the word line WLj begins to rise from LOW to HIGH and the voltage of the digit line DTi begins to fall from HIGH to LOW, the cell data (voltage) of the node QT in the memory cell 1 begins to fall from HIGH to LOW. Here, in the conventional memory cell 101, the charge is supplied from the load transistor P11 through the access transistor N11 to the digit line DTi. For this reason, conventionally, the bus fight is generated by the load transistor P11 and the writing buffer (not shown) provided for the digit line DTi. As a result, the voltage of the node QT in the memory cell 101 gradually falls from HIGH to LOW, as shown in FIG. 7 by a thin dotted line A. On the other hand, in the present invention, when the voltage of the word line WLj becomes HIGH, the power source control transistors P12 and P22 in the memory cell 1 are turned OFF, and the current path from the load transistors P11 and P21 are shut off by the power source control transistors P12 and P22. For this reason, in the present invention, the voltage of the node QT in the memory cell 1 falls down more quickly than that of the conventional memory cell, as shown in FIG. 7 by a thick solid line B.

Also, the supply of the power source voltage VDD from the load transistor P21 to the node QB in the memory cell 1 is stopped by the power source control transistor P22. That is, the drive transistor N22 is operatively disconnected from the load transistor P21 by the power source control transistor P22. However, the power source voltage VDD is supplied through the access transistor N21 from the digit line DBi. Specifically, when the power source voltage is assumed to be VDD and a threshold voltage of the access transistor N21 is assumed to be Vtn, the voltage of (VDD−Vtn) is supplied to the node QB.

Next, at the drive ending step, the address controller 4 supplies the ground voltage GND to the word line WLj in response to the falling of the clock, so that the voltage of the word line WLj is changed from the power source voltage VDD (HIGH) to the ground voltage GND (LOW). Also, the pre-charging circuit 2-i supplies the power source voltage VDD to the digit line DTi in response to the falling of the clock, so that the voltage of the digit line DTi is changed from the ground voltage GND (LOW) to the power source voltage VDD (HIGH). At this time, the voltage of the node QB is pulled up from the voltage (VDD−Vtn) to the power source voltage VDD.

In this way, by the power source supply stopping step, the voltage of the node QT is rewritten to the LOW (the ground voltage GND), and by the drive ending step, the voltage of the node QB is rewritten to the HIGH (the power source voltage VDD).

In the memory cells 1 which are connected to the word line WLj, and to which the writing operation is not carried out, and in case of the reading operation, when the power source control transistors P12 and P22 of the memory cells 1 are turned OFF, the power source supply from the load transistors P11 and P21 are shut off, and the voltage of the node QB becomes floating. In this case, the digit lines DTi and DBi have been pre-charged. Thus, although the cell data of the node QB is floating, the cell data is never inverted.

Second Embodiment

Next, the semiconductor integrated circuit device with the memory cells 1 according to the second embodiment of the present invention will be described below. Here, the description of the same components as those of the first embodiment are omitted.

Figure 8:
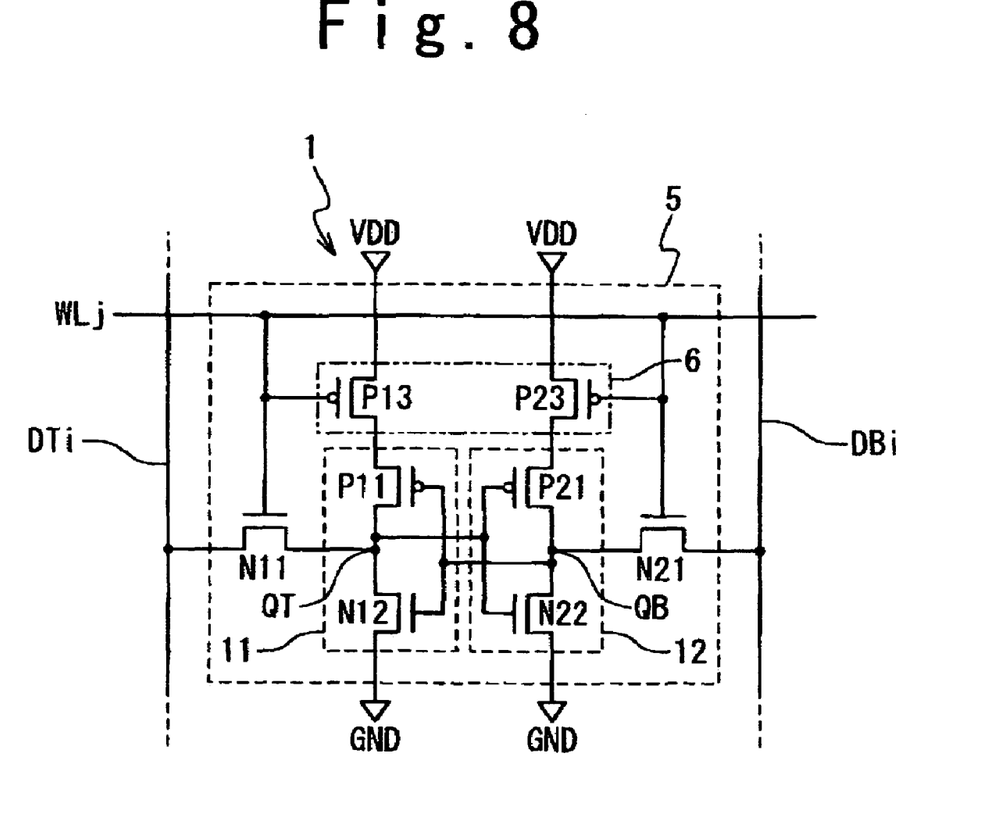
FIG. 8 is a circuit diagram showing the static random access memory cell according to a second embodiment of the present invention.

In the second embodiment, as shown in FIG. 8, the switching section 6 includes power source control transistors P13 and P23 as first and second switching sections, instead of the power source control transistors P12 and P22 in the first embodiment, respectively. The power source control transistors P13 and P23 are the PMOS transistors. The power source control transistor P13 is provided between the power source for supplying the power source voltage VDD and the load transistor P11 of the inverter 11. The power source control transistor P23 is provided between the foregoing power source and the load transistor P21 of the inverter 21. In this case, in the access transistor N11, its gate is connected to the word line WLj, its drain is connected to the digit line DTi, and its source is connected through the node QT to the drain of the drive transistor N12, the gate of the drive transistor N22, the drain of the load transistor P11, and the gate of the load transistor P21. In the power source control transistor P13, its gate is connected to the word line WLj, its drain is connected to the drain of the load transistor P11, and its source is connected to the power source. In the access transistor N21, its gate is connected to the word line WLj, its drain is connected to the digit line DBi, and its source is connected through the node QB to the gate of the drive transistor N12, the drain of the drive transistor N22, the drain of the load transistor P21, and the gate of the load transistor P11. In the power source control transistor P23, its gate is connected to the word line WLj, its drain is connected to the source of the load transistor P21, and its source is connected to the power source. The drain of the power source control transistor P13 and the drain of the power source control transistor P23 are connected. The power source voltage VDD is supplied to the sources of the power source control transistors P13 and P23 from the power source. The sources of the drive transistors N12 and N22 are grounded, to supply the ground voltage GND.

In the second embodiment, similarly to the first embodiment, at the time of the writing operation, when the word line WLj is selected and driven, namely, when the voltage supplied to the word line WLj indicates the active state (HIGH), the power source control transistors P13 and P23 stop the supply of the power source voltage VDD to the drive transistors N12 and N22 through the load transistors P11 and P21, respectively. That is, the load transistors P11 and P21 are operatively disconnected from the power source.

Also, in the second embodiment, the sources of the power source control transistors P13 and P23 are connected to each other. For this reason, when the word line WLj is not driven or selected, namely, when the voltage of the word line WLj indicates the inactive state (LOW), the drains of the load transistors P11 and P21 are kept at a same voltage, and the operation of the latching section is stable in the memory cell 1 connected to the word line WLj, irrespectively of the variations in the properties of the power source control transistors P13 and P23.

Figure 9:
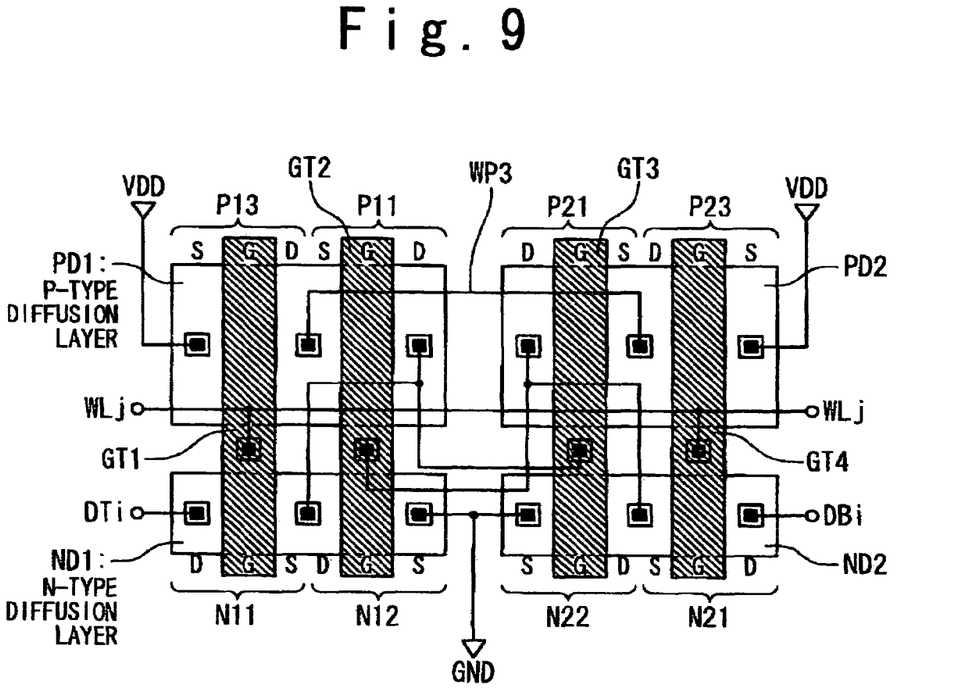
FIG. 9 is a layout diagram showing the static random access memory cell according to the second embodiment of the present invention.

Also, in the second embodiment, similarly to the first embodiment, when the gate array is assumed, the wiring pattern as shown in FIG. 9 can be used. In the configuration of the memory cell 1, the number of the transistors is increased by 2, as compared with the memory cell 101 of the conventional 6-transistor structure. However, similarly to the first embodiment, the excessive transistors can be effectively utilized. Therefore, the layout area is not substantially increased over the conventional example.

As shown in FIG. 9, in the layout of the memory cell in the second embodiment, the transistors P12 and P22 in the first embodiment of FIG. 6 are changed to the transistors P13 and P23. Also, the word line WLj is connected to the gate patterns GT1 and GT4. The drain of the drive transistor N22, the source of the access transistor N21 and the drain of the load transistor P21 are connected to the gate pattern GT2 by a first wiring. Also, the source of the access transistor N11, the drain of the drive transistor N12 and the drain of the load transistor P11 are connected to the gate pattern GT3.

Also, the drain of the power source control transistor P13 and the drain of the load transistor P23 are connected to each other by a wiring pattern WP3. This wiring pattern is not shown in FIG. 8 and may be omitted.

The operation of the semiconductor integrated circuit device with the memory cell 1 according to the second embodiment of the present invention is the same as that of the first embodiment. Also, in the second embodiment, even the performance and effect in the writing operation are equal to those of the first embodiment.

As described above, according to the present invention, the speed of the writing operation can be made faster. By shutting off the current paths to the output nodes QT and QB in the inverters 11 and 21 by the load transistors P11 and P21 or P13 and P23 from the power source voltage VDD at the time of the writing operation, it is possible to avoid the bus fight between the load transistors P11 and P21 and writing NMOS transistors in the writing buffers and attain the faster writing operation. The present invention is especially effective in case that the current drive capabilities of the PMOS transistor and the NMOS transistor in the memory cell are equal to each other, as in the gate array and the like.

In the memory cell 101 disclosed in the above-mentioned Japanese Laid Open Patent Application (JP-A-Heisei, 6-236688), the parasitic capacitance of the wiring L100 prevents the faster writing operation. In the memory cell 1 of the present invention, there is no element for delaying the writing operation, such as the large parasitic capacitance.

Also, according to the memory cell of the present invention, it is possible to make the speed of the writing operation much faster without increasing the area. In the LSI such as the gate array, the general-purpose performance is importance, and the PMOS transistors and the NMOS transistors are arranged in advance to make it possible to form an optional logic in the post process. For this purpose, in many cases, the same numbers of the transistors are provided to allow the PMOS transistors and the NMOS transistors to be used as pairs. In this case, in the conventional memory cell 101, the four NMOS transistors and the two PMOS transistors, and the two PMOS transistors are left unused. In the memory cell in the present invention, the unused two PMOS can be used for control of the power source supply. Therefore, if the above-mentioned layout is designed as shown in FIGS. 6 and 9, the layout area is not increased as compared with the conventional memory cell 101.

What is claimed is:

1. A memory cell comprising:
a memory cell section comprising first and second inverters which are connected to form a flip-flop, wherein each of said first and second inverters comprises a p-type load transistor and an n-type drive transistor; and
a switching section connected with a word line and configured to operatively disconnect said drive transistors of said first and second inverters from a power source when said word line is driven,
wherein an output terminal of each said inverter, as used to provide an input into the other inverter to form said flip-flop, is located between said switching section and said drive transistor of said inverter.

2. The memory cell according to claim 1, further comprising: first and second access transistors connected with said word line, provided between said output terminals of said first and second inverters and first and second digit lines, respectively, such that said first and second access transistors are turned on when said word line is driven.

3. The memory cell according to claim 1, wherein said switching section comprises:
first and second switch sections respectively provided for said first and second inverters to operatively disconnect said drive transistors of said first and second inverters from a power source when said word line is driven.

4. The memory cell according to claim 3, wherein said first and second switch sections are connected with said word line and provided between said power source and said first and second inverters, and
when said word line is driven, said first switch section shuts off a current path between said power source and said output terminal of said first inverter, and said second switch section shuts off a current path between said power source and said output terminal of said second inverter.

5. The memory cell according to claim 3, wherein said first and second inverters are connected with said power source,
said first switch section is connected with said word line and provided between said load transistor and said drive transistors of said first inverter,
said second switch section is connected with said word line and provided between said load transistor and said drive transistors of said second inverter, and
when said word line is driven, said first switch section shuts off a current path between said load transistor and said drive transistor in said first inverter, and said second switch section shuts off a current path between said load transistor and said drive transistor in said second inverter.

6. The memory cell according to claim 1, wherein each of said first and second switch sections has a gate connected with said word line and comprises a MOS transistor of a same conductive type as said load transistor, and
said drive transistors in said first and second inverters are of a different conductive type from said load transistor.

7. A semiconductor integrated circuit device comprising:
a memory cell array comprising:
a plurality of word lines extending into a first direction,
a plurality of pairs of digit lines extending into a second direction substantially orthogonal to said first direction, and
a plurality of memory cells arranged in a matrix at intersections of said plurality of word lines and said plurality of pairs of digit lines; and
an address control section configured to select one of said plurality of word lines based on a first address,
wherein each of said plurality of memory cells comprises:
a memory cell section comprising first and second inverters which are connected to form a flip-flop, wherein each of said first and second inverters comprises a p-type load transistor and an n-type drive transistor; and
a switching section connected with one of said plurality of word lines and configured to operatively disconnect said drive transistors of said first and second inverters from a power source when said word line is selected,
wherein an output terminal of each said inverter, as used to provide an input into the other inverter to form said flip-flop, is located between said switching section and said drive transistor of said inverter.

8. The semiconductor integrated circuit device according to claim 7, wherein said memory cell further comprises:
first and second access transistors connected with said word line, provided between said output terminals of said first and second inverters and digit lines of a corresponding one of said plurality of pairs, respectively, such that said first and second access transistors are turned on when said word line is selected.

9. The semiconductor integrated circuit device according to claim 7, wherein said switching section comprises:
first and second switch sections respectively provided for said first and second inverters to operatively disconnect said drive transistors of said first and second inverters from a power source when said word line is selected.

10. The semiconductor integrated circuit device according to claim 9, wherein said first and second switch sections are connected with said word line and provided between said power source and said first and second inverters, and
when said word line is driven, said first switch section shuts off a current path between said power source and said output terminal of said first inverter, and said second switch section shuts off a current path between said power source and said output terminal of said second inverter.

11. The semiconductor integrated circuit device according to claim 9, wherein said first and second inverters are connected with said power source,
said first switch section is connected with said word line and provided between said load transistor and said drive transistors of said first inverter,
said second switch section is connected with said word line and provided between said load transistor and said drive transistors of said second inverter, and
when said word line is driven, said first switch section shuts off a current path between said load transistor and said drive transistor in said first inverter, and said second switch section shuts off a current path between said load transistor and said drive transistor in said second inverter.

12. The semiconductor integrated circuit device according to claim 7, wherein each of said first and second switch sections has a gate connected with said word line and comprises a MOS transistor of a same conductive type as a load transistor as said load, and
said drive transistors in said first and second inverters are of a different conductive type from said load transistor.

13. A semiconductor integrated circuit device comprising:
first and second p-type diffusion layers arranged in a first direction;
first and second n-type diffusion layers arranged in said first direction along said first and second p-type diffusion layers;
first and second gate lines provided above said first p- and n-type diffusion layers to extend in a second direction orthogonal to said first direction such that first and second p-channel transistors and first and second n-channel transistors are formed;
third and fourth gate lines provided above said second p- and n-type diffusion layers to extend in said second direction such that third and fourth p-channel transistors and third and fourth n-channel transistors are formed;
a word line provided above said first to fourth gate lines to extend in said first direction and connected with said first and fourth gate lines,
said second p- and n-channel transistors forms a first inverter, and said third p- and n-channel transistors forms a second inverter,
said first and second inverter are connected with each other to form a flip-flop,
said first and fourth n-channel transistors are connected with digit lines, respectively, and
sources of said second and third n-channel transistors are connected to a ground voltage.

14. The semiconductor integrated circuit device according to claim 13, wherein said first p-channel transistor is connected between said second p-channel transistor and said second n-channel transistor,
said fourth p-channel transistor is connected between said third p-channel transistor and said third n-channel transistor, and
sources of said second and third p-channel transistors are connected with a power source.

15. The semiconductor integrated circuit device according to claim 13, wherein sources of said first and fourth p-channel transistors are connected with a power source,
said first p-channel transistor is connected between said power source and said second p-channel transistor, and
said fourth p-channel transistor is connected between said power source and said third p-channel transistor.

16. The semiconductor integrated circuit device according to claim 15, wherein a first common region as a drain of said first p-channel transistor and a source of said second p-channel transistor is connected with a second common region as a drain of said fourth p-channel transistor and a source of said third p-channel transistor.

* * * * *